(12) United States Patent
Joshi et al.

(10) Patent No.: US 7,217,978 B2
(45) Date of Patent: May 15, 2007

(54) SRAM MEMORIES AND MICROPROCESSORS HAVING LOGIC PORTIONS IMPLEMENTED IN HIGH-PERFORMANCE SILICON SUBSTRATES AND SRAM ARRAY PORTIONS HAVING FIELD EFFECT TRANSISTORS WITH LINKED BODIES AND METHOD FOR MAKING SAME

(75) Inventors: Rajiv V. Joshi, Yorktown Heights, NY (US); Richard Andre Wachnik, Mount Kisco, NY (US); Yue Tan, Fishkill, NY (US); Kerry Bernstein, Underhill, VT (US)

(73) Assignee: International Business Machines Corporation, Armonk, NY (US)

( * ) Notice: Subject to any disclaimer, the term of this patent is extended or adjusted under 35 U.S.C. 154(b) by 193 days.

(21) Appl. No.: 11/038,593

(22) Filed: Jan. 19, 2005

(65) Prior Publication Data
US 2006/0157788 A1    Jul. 20, 2006

(51) Int. Cl.
*H01L 27/01* (2006.01)
(52) U.S. Cl. .............................. 257/351; 257/E27.098
(58) Field of Classification Search ................ 257/351, 257/E27.098
See application file for complete search history.

(56) References Cited

U.S. PATENT DOCUMENTS

| | | | |
|---|---|---|---|
| 4,965,213 A * | 10/1990 | Blake | 438/154 |
| 5,906,951 A | 5/1999 | Chu et al. | 438/751 |
| 6,059,895 A | 5/2000 | Chu et al. | 148/33.1 |
| 6,316,808 B1 | 11/2001 | Smith, III | 257/339 |
| 6,344,671 B1 | 2/2002 | Mandelman et al. | 257/296 |
| 6,387,739 B1 | 5/2002 | Smith, III | 438/157 |
| 6,603,156 B2 | 8/2003 | Rim | 257/190 |
| 6,621,727 B2 | 9/2003 | Chen | 365/154 |
| 6,624,459 B1 | 9/2003 | Dachtera et al. | 257/296 |
| 6,627,952 B1 | 9/2003 | Wollesen | 257/347 |
| 6,642,536 B1 | 11/2003 | Xiang et al. | 257/19 |
| 6,661,253 B1 | 12/2003 | Lee et al. | 326/41 |

* cited by examiner

*Primary Examiner*—Lex Malsawma
(74) *Attorney, Agent, or Firm*—Harrington & Smith, PC

(57) ABSTRACT

The present invention generally concerns fabrication methods and device architectures for use in memory circuits, and more particularly concerns hybrid silicon-on-insulator (SOI) and bulk architectures for use in memory circuits. Once aspect of the invention concerns CMOS SRAM cell architectures where at least one pair of adjacent NFETs in an SRAM cell have body regions linked by a leakage path diffusion region positioned beneath shallow source/drain diffusions, where the leakage path diffusion region extends from the bottom of the source/drain diffusion to the buried oxide layer, and at least one pair of NFETs from adjacent SRAM cells which have body regions linked by a similar leakage path diffusion region beneath adjacent source/drain diffusions. Another aspect of this invention concerns a microprocessor fabricated on an hybrid orientation substrate where the logic portion of the circuit has NFETs fabricated in (100) crystal orientation SOI silicon regions with floating body regions and PFETs fabricated in (110) crystal orientation bulk silicon regions; and where the SRAM memory portion has NFETs fabricated in (100) crystal orientation SOI silicon regions with body regions linked by leakage path diffusion regions beneath shallow source/drain diffusions and PFETs fabricated in (110) crystal orientation silicon regions.

51 Claims, 11 Drawing Sheets

SRAM MEMORIES AND MICROPROCESSORS HAVING LOGIC PORTIONS IMPLEMENTED IN HIGH-PERFORMANCE SILICON SUBSTRATES AND SRAM ARRAY PORTIONS HAVING FIELD EFFECT TRANSISTORS WITH LINKED BODIES AND METHOD FOR MAKING SAME

TECHNICAL FIELD

The present invention generally concerns fabrication methods and device architectures for use in memory circuits, and more particularly concerns hybrid silicon-on-insulator (SOI) and bulk architectures for use in memory circuits.

BACKGROUND

There are several semiconductor memory types available for use in constructing memory components for incorporation in computers and other electronic devices. In addition, there are numerous semiconductor fabrication processes available for forming memory components operating in accordance with the several semiconductor memory types. Further, almost continual progress is being made in process and fabrication techniques, resulting in improvements to component speed and stability of operation and reductions in component size and power consumption. In such a situation it is therefore a continuing challenge to adapt emerging process, fabrication and device improvements to semiconductor memories in such a way that the maximum benefit is derived from the improvements.

For example, regarding semiconductor memory types two are most common—dynamic random access memories (hereinafter "DRAMs") and static random access memories (hereinafter "SRAMs"). A DRAM memory is comprised of DRAM cells which essentially are capacitors for storing charge; the states of the capacitors constitute the memory states of the DRAM cell. DRAMs have relatively high memory densities in comparison to other memory technologies, for example SRAM memories, but this comes at a cost. For various reasons well-known to those skilled in the art, capacitors comprising the memory cells in DRAM devices cannot maintain their charge states in perpetuity and therefore have to be occasionally refreshed in order not to lose their memory state.

In contrast to DRAMs, SRAMs store information in bistable semiconductor circuits. More devices need to be fabricated in order to construct an SRAM memory cell in comparison to a DRAM memory cell, resulting in DRAMs generally achieving better memory density. On the other hand, SRAMs need not be refreshed in the manner of capacitive DRAMs. In addition, SRAMs generally have shorter read/write cycle times. Thus, SRAMs often are used in microprocessors in so-called "cache memory."

FIG. 1 shows a cross section of a prior art SRAM through a pair of NFET transistors 142, 144. The NFETs 142, 144 are formed in a thin silicon surface layer 130 that is isolated from an underlying silicon substrate 110 by a buried oxide (BOX) layer 120. In a typically complex series of mask steps, silicon-on-insulator ("SOI") regions are formed in the silicon surface layer 130 by etching shallow trenches through the surface layer 130 and filling the shallow trenches with oxide to isolate regions from one another. This type of isolation is normally referred to as shallow trench isolation ("STI"). STI is used to isolate circuits formed in the regions from each other and, also, isolate the FETs forming the circuits from each other.

After forming a gate oxide layer on the surface of the silicon regions, gates 116 are patterned and formed at the location of devices 142, 144. Source/drain regions 132 are defined using a standard implant and diffusion step, after forming lightly doped diffusion regions 134 at the gate boundaries, if desired. Device channels 136 are completely isolated from other channels by source/drain diffusions 132 at either end, BOX layer 120 below, gate oxide above and STI (not shown) along the sides of the channel. Further, "halo" regions 133 have been formed between the source/drain regions 132 and channel 136 through a separate diffusion step of the same dopant type used to form the body regions but at a higher concentration.

Ideally, the thin silicon surface layer 130 is no thicker than what is necessary to form a channel 136 between a pair of source/drain diffusions 132. However, in practice, the silicon surface layer can be thicker than the depth of the FET's channel inversion layer. So, when the channel inversion layer forms, i.e., when the FET is turned on, an uninverted layer can remain beneath the channel inversion layer. This uninverted layer remains isolated, resistively, from adjacent regions and any charge that is introduced into the uninverted channel region remains trapped there until it leaks out through junction leakage or is otherwise coupled out. This trapped charge can produce unwanted device channel bias resulting in what is referred to as body effects that are localized to an individual device.

So, these prior art SOI FETs 142, 144 have isolated floating channels (body regions)136 that are not biased by any bias voltage. Thus, the channel bias of any device is dependent upon its current operating state and the device's history, i.e., any remaining charge that has been previously introduced through capacitive coupling or bipolar injection. For typical individual logic circuits such as, decoders, clock buffers, input or output drivers and array output drivers, variations in device characteristics resulting from floating device channels are predicted in device models and are accounted for in chip timing.

Localized body effects present significant problems for CMOS SOI SRAM arrays. This floating body effect allows the body potential and threshold voltage to vary from device to device within a single cell, introducing a use-dependent bias. There are several contributors to this variation or mismatch and body potential is a significant contributor. If the mismatch between devices is sufficiently large the cell will be disturbed during a read or a write operation and even in an idle state. Then data may be lost.

It is known that coupling the bodies of the devices reduces the body potential and threshold mismatch of the devices and so enhances the stability of SRAM cells. Known methods of doing this are to use so-called body-contacted SOI MOSFET transistors. When applied to CMOS SRAM cells, these methods significantly increase cell area and process complexity. The increase in area can be as much as two to three times for each transistor with a small dimension as used in SRAM cells and sums to form at least a two-times-larger SRAM cell. Another drawback is that the parasitic capacitance associated with the polysilicon gate and diffusions of the body-contacted transistor will degrade the SRAM array performance.

Problems have been encountered in other areas as well. Advances have been made in fundamental substrate fabrication techniques which now permit portions of a substrate to be fabricated in silicon with different crystal orientations.

It has long been known that PFETs experience improved performance when fabricated in (110) crystal orientation silicon due to the increased mobility of the majority carrier (holes) in (110) crystal orientation silicon. It has only become possible recently to form (110) crystal orientation silicon regions no larger than the PFET devices themselves so that such regions can be incorporated in an otherwise (100) crystal orientation substrate without sacrificing device density. Although advantageous, the hybrid substrate technology must be used judiciously so that the potential improvements in device performance achievable with such technology are not blunted through sub-optimal decisions concerning other design issues, for example, overcoming the floating body effect.

Those skilled in the art thus desire CMOS SRAM cell architectures that overcome the problems associated with the floating body effect without sacrificing the gains made by fabricating the device in SOI, for example, improved read/write speeds and lower power consumption. In particular, such an improved CMOS SRAM cell architecture would have improved stability, and experience far fewer anomalies during read/write operations.

In addition those skilled in the art desire improved SRAM cell layouts that derive increased benefit from linked body technology; in particular, those skilled in the art desire SRAM cell layouts that reduce the resistance encountered in devices having linked bodies.

Further, those skilled in the art also desire the judicious use of state of the art device structures to improve the performance of the logic and memory portions of SRAM memories or microprocessors. In particular, those skilled in the art desire the application of state of the art device structures to improve the speed of logic operations in the logic portion of an SRAM memory or microprocessor and the stability of the memory portion of the SRAM memory or microprocessor.

SUMMARY OF THE PREFERRED EMBODIMENTS

A first embodiment of the present invention comprises an SRAM array comprising a plurality of SRAM cells, each of said SRAM cells comprising: a pair of cross-coupled CMOS inverters in a surface silicon layer disposed on an SOI buried-oxide layer, where each cross-coupled inverter comprises an NFET and a PFET; a pair of NFET pass gates selectively coupling a pair of bit lines to said cross-coupled CMOS inverters; and where at least two adjacent NFETs of the SRAM cell share a leakage path between body regions, and where the at least two adjacent NFETs have a source/drain diffusion region and a leakage path diffusion region under the source/drain diffusion region positioned between their respective body regions, wherein the source/drain diffusion region extends fractionally into the surface silicon layer and the leakage path diffusion region extends from a bottom of the source/drain diffusion down to the SOI buried-oxide layer, and where the leakage path diffusion region is counter-doped with the same dopant type as the source/drain diffusion but at relatively lower concentrations than the source/drain diffusion, thereby presenting a lower barrier to junction leakage than the source/drain regions.

A second embodiment of the present invention comprises a pair of adjacent SRAM cells in an SRAM array, the pair comprising a first SRAM cell and a second SRAM cell, each of the adjacent SRAM cells comprising: a pair of cross-coupled CMOS inverters in a surface silicon layer disposed on an SOI buried oxide layer, where each cross-coupled inverter comprises an NFET and a PFET; a pair of NFET pass gates selectively coupling a pair of bit lines to said cross-coupled CMOS inverters; and where at least one of the NFETs from the first SRAM cell and at least one of the NFETs from the second SRAM cell share a leakage path between body regions, the respective NFETs sharing a leakage path being adjacent to one another and where the at least two adjacent NFETs have a source/drain diffusion region and a leakage path diffusion region under the source/drain diffusion region positioned between their respective body regions, wherein the source/drain diffusion region extends fractionally into the surface silicon layer and the leakage path diffusion region extends from a bottom of the source/drain diffusion down to the SOI buried-oxide layer, and where the leakage path diffusion region is counter-doped with the same dopant type as the source/drain diffusion but at relatively lower concentrations than the source/drain diffusion, thereby presenting a lower barrier to junction leakage than the source/drain regions.

A third alternate embodiment of the present invention comprises a pair of adjacent SRAM cells in an SRAM array, the pair comprising a first SRAM cell and a second SRAM cell, each of the adjacent SRAM cells comprising: a pair of cross-coupled CMOS inverters in a surface silicon layer disposed on an SOI buried oxide layer, where each cross-coupled inverter comprises an NFET and a PFET; a pair of NFET pass gates selectively coupling a pair of bit lines to said cross-coupled inverters; and where at least one of the PFETs from the first SRAM cell and at least one of the PFETs from the second SRAM cell share a leakage path between body regions, the respective PFETs sharing a leakage path being adjacent to one another and where the at least two adjacent PFETs have a source/drain diffusion region and a leakage path diffusion region under the source/drain diffusion region positioned between their respective body regions, wherein the source/drain diffusion region extends fractionally into the surface silicon layer and the leakage path diffusion region extends from a bottom of the source/drain diffusion down to the SOI buried-oxide layer, and where the leakage path diffusion region is counter-doped with the same dopant type as the source/drain diffusion but at relatively lower concentrations than the source/drain diffusion, thereby presenting a lower barrier to junction leakage than the source/drain regions.

A fourth alternate embodiment of the present invention comprises a pair of adjacent SRAM cells in an SRAM array, the pair comprising a first SRAM cell and a second SRAM cell, where each of the SRAM cells have two longitudinal and two lateral sides, the adjacent SRAM cells sharing a longitudinal side, each of the adjacent SRAM cells comprising: a pair of cross-coupled CMOS inverters in a surface silicon layer disposed on an SOI buried-oxide layer, wherein the cross-coupled CMOS inverters each comprise an NFET and a PFET; a pair of NFET pass gates selectively coupling a pair of bit lines to said cross-coupled CMOS inverters, and wherein one each of the pass gate NFETs and inverter NFETs are positioned along each of the lateral sides of the SRAM cell, whereby the pass gate NFET and inverter NFET positioned on the same lateral side of the SRAM cell comprise a pair and have body regions linked with leakage path diffusion regions formed beneath adjacent shallow source/drain diffusions wherein the shallow source/drain diffusion region extends fractionally into the surface silicon layer and the leakage path diffusion region extends from a bottom of the source/drain diffusion down to the SOI buried-oxide layer, and where the leakage path diffusion region is counter-doped with the same dopant type as the source/drain diffusion but at relatively lower concentrations than the source/drain diffusion, thereby presenting a lower barrier to junction leakage than the source/drain regions.

A fifth alternate embodiment of the present invention comprises an SRAM array comprising a plurality of SRAM cells organized in rows and columns, wherein each of the SRAM cells have two longitudinal sides and two lateral sides, the SRAM cells further comprising: a pair of cross-coupled CMOS inverters in a surface silicon layer disposed on an SOI buried-oxide layer, where each cross-coupled inverter comprises an NFET and a PFET; a pair of NFET pass gates selectively coupling a pair of bit lines to said cross-coupled CMOS inverters; and where at least two adjacent NFETs of the SRAM cell share a leakage path between body regions, and where the at least two adjacent NFETs have a source/drain diffusion region and a leakage path diffusion region under the source/drain diffusion region positioned between their respective body regions, wherein the source/drain diffusion region extends fractionally into the surface silicon layer and the leakage path diffusion region extends from a bottom of the source/drain diffusion down to the SOI buried-oxide layer, wherein the leakage path diffusion region is counter-doped with the same dopant type as the source/drain diffusion but at relatively lower concentrations than the source/drain diffusion, thereby presenting a lower barrier to junction leakage than the source/drain regions, and where each of the SRAM cells arrayed in a particular row of the SRAM array share longitudinal sides with two other SRAM cells positioned in the same row, except for at least two of the SRAM cells one longitudinal side of each coincides with a termination point of the row, and where the at least two adjacent NFETs of each SRAM cell arrayed in the particular row of the SRAM array having body regions linked by the leakage path diffusion region have their body regions further linked to the body regions of NFETs contained in adjacent SRAM cells sharing longitudinal sides with the SRAM cell with leakage path diffusion regions positioned beneath adjacent shallow source/drain diffusion regions, except for the at least two of the SRAM cells having one longitudinal side coinciding with the termination point of the row which have at least one pair of NFETs having a body region linked to the body regions of NFETs positioned in one SRAM cell on a longitudinal side opposite from the termination point of the row with leakage path diffusion regions positioned beneath adjacent shallow source/drain diffusion regions; and whereby a continuous chain of NFETS having body regions linked with leakage path diffusion regions positioned beneath adjacent shallow source/drain diffusion regions exists across the particular row of the SRAM array.

A sixth alternate embodiment of the present invention comprises a microprocessor fabricated on a CMOS hybrid orientation substrate, wherein the microprocessor comprises a logic portion and a cache memory portion, wherein the cache memory portion further comprises at least one CMOS SRAM array and where: the logic portion comprises, in part, PFETs fabricated in (110) crystal orientation bulk silicon regions and NFETs fabricated in (100) crystal orientation SOI silicon regions, wherein the NFETs in the logic portion have floating body regions; and the CMOS SRAM array comprises a plurality of CMOS SRAM cells comprising, in part, PFETs fabricated in (110) crystal orientation silicon regions and NFETs fabricated in (100) crystal orientation SOI silicon regions, wherein at least a portion of the NFETs in the CMOS SRAM cells have body regions linked to body regions of adjacent NFETs with leakage path diffusion regions formed beneath adjacent shallow source/drain diffusions wherein the source/drain diffusion regions extend fractionally into a surface silicon layer and the leakage path diffusion regions extends from bottoms of the source/drain diffusions down to an SOI buried-oxide layer, and where the leakage path diffusion regions are counter-doped with the same dopant type as the source/drain diffusions but at relatively lower concentrations than the source/drain diffusions, thereby presenting a lower barrier to junction leakage than the source/drain regions.

A seventh alternate embodiment comprises a method of forming an SRAM array comprising a plurality of SRAM cells, each of the SRAM cells comprising a pair of cross-coupled CMOS inverters in a surface silicon layer disposed on an SOI buried-oxide layer, where each cross-coupled inverter comprises an NFET and a PFET and the SRAM cell further comprises a pair of NFET pass gates selectively coupling a pair of bit lines to said cross-coupled CMOS inverters, the method comprising: forming a buried oxide layer in a silicon wafer, the buried oxide layer positioned between a surface silicon layer and a silicon substrate; forming a plurality of PFET and NFET gates above body regions in the surface silicon layer; forming a leakage path diffusion region between at least a pair of adjacent NFET body regions wherein the leakage path diffusion region is counter-doped with a same dopant type as a shallow source/drain diffusion to be formed in another step but at relatively lower concentration than the shallow source/drain diffusions, thereby presenting a lower barrier to junction leakage than the source/drain regions, the leakage path diffusion region extending to the buried oxide layer; and forming the shallow source/drain diffusions above the leakage path diffusion regions, the shallow source/drain diffusions extending fractionally into the surface silicon layer.

An eighth alternate embodiment of the present invention comprises an SRAM memory comprising: peripheral logic fabricated in a high-performance silicon substrate; an SRAM array comprised of a plurality of SRAM cells, wherein the SRAM cells are arrayed in rows and columns and further comprise: a pair of cross-coupled CMOS inverters in a surface silicon layer disposed on an SOI buried-oxide layer, wherein the cross-coupled CMOS inverters each comprise an NFET and a PFET; a pair of NFET pass gates selectively coupling a pair of bit lines to said cross-coupled CMOS inverters, where body regions of NFETs arrayed along a column of SRAM cells coinciding with a bit line are linked by leakage path diffusion regions beneath adjacent shallow source drain diffusion regions, thereby forming a chain of linked body regions.

In one variant of the eighth alternate embodiment, the high-performance silicon substrate of the peripheral logic comprises a strained silicon region.

In another variant of the eighth alternate embodiment, the high-performance silicon substrate of the peripheral logic comprises a hybrid orientation substrate, where the NFETs are fabricated in (100) crystal orientation silicon regions and PFETs are fabricated in (110) crystal orientation silicon regions.

A ninth alternate embodiment of the present invention comprises an SRAM memory comprising: peripheral logic comprised of CMOS NFETs and PFETs, where the NFETs are fabricated in bulk silicon regions and the PFETs are fabricated in SOI silicon regions, where body regions of the PFETs are floating; and an SRAM array comprised of a plurality of SRAM cells, wherein the SRAM cells are arrayed in rows and columns and further comprise: a pair of cross-coupled CMOS inverters in a surface silicon layer disposed on an SOI buried-oxide layer, wherein the cross-coupled CMOS inverters each comprise an NFET and a PFET; a pair of NFET pass gates selectively coupling a pair of bit lines to said cross-coupled CMOS inverters; where body regions of NFETs along a column of SRAM cells coinciding with a bit line are linked by leakage path diffusion regions beneath adjacent shallow source drain diffusion regions, thereby forming a chain of linked body regions.

A tenth alternate embodiment of the present invention comprises a method of forming an SRAM memory comprised of an SRAM array portion and a peripheral logic portion, where the SRAM array portion is comprised of a plurality of SRAM cells, and where each of the SRAM cells further comprises a pair of cross-coupled CMOS inverters in a surface silicon layer disposed on an SOI buried-oxide layer, where each cross-coupled inverter comprises an NFET and a PFET and the SRAM cell further comprises a pair of NFET pass gates coupling a pair of bit lines to the cross-coupled CMOS inverters, the method comprising: forming a high-performance silicon substrate portion in a silicon wafer; forming circuits comprising the peripheral logic portion of the SRAM memory in the high-performance silicon substrate portion of the silicon wafer; forming the SRAM array portion of the SRAM memory by: forming a buried oxide layer in the silicon wafer, the buried oxide layer positioned between a surface silicon layer and a silicon substrate; forming a plurality of PFET and NFET gates above body regions in the surface silicon layer; forming a leakage path diffusion region between at least a pair of adjacent NFET body regions wherein the leakage path diffusion regions are counter-doped with a same dopant type as a shallow as a shallow source/drain diffusion to be formed in another step but at a relatively lower concentration than the shallow source/drain diffusions, thereby presenting a lower barrier to junction leakage than the source/drain regions, the leakage path diffusion region extending to the buried oxide layer; and forming the shallow source/drain diffusions above the leakage path diffusion regions, the shallow source/drain diffusions extending fractionally into the surface silicon layer.

In one variant of the tenth alternate embodiment the high-performance silicon substrate portion comprises a hybrid orientation substrate having (100) crystal orientation silicon regions and (110) crystal orientation silicon regions.

In another variant of the tenth alternate embodiment, the high-performance silicon substrate portion comprises a strained silicon region.

Thus it is seen that embodiments of the present invention overcome limitations of the prior art. Known device structures suitable for use in overcoming the floating body effect in SOI SRAM arrays suffer from a number of drawbacks. In particular, one known method comprising the use of body-contacted SOI MOSFET transistors significantly increases SRAM cell area and processing complexity. The present invention significantly reduces the need for increased SRAM cell area and further reduces the resistance of the leakage path used to join the body regions through an improved SRAM cell layout.

In addition, embodiments of the present invention improve the overall performance of SRAM memories by applying high-performance substrate technologies to peripheral logic portions of SRAM memories to improve the speed of operation of such portions, while applying linked body technology to the memory array portion of the SRAM memory to improve the stability of the array. This can be accomplished with differing high-performance substrate technologies; for example, strained silicon substrates or hybrid orientation substrates. Strained silicon substrates, which are relatively less expensive to fabricate when compared to hybrid orientation substrates, can be used in applications where improved performance is sought. In other applications where state-of-the-art performance is sought, hybrid orientation substrates can be used to achieve the fastest possible operation for the peripheral logic portions of SRAM memories.

Further, the present invention judiciously applies state of the art device structures to accomplish improved overall performance for microprocessors. In particular, the present invention applies hybrid orientation technology in combination with advances in overcoming the floating body effect to achieve an overall improvement in microprocessor performance. In particular, fabrication of the logic portion of a microprocessor in CMOS with NFETs in (100) crystal orientation SOI silicon where the NFETs have floating bodies and PFETs in (110) crystal orientation bulk silicon improves the operating speed of the logic portion of the microprocessor.

In conclusion, the foregoing summary of the alternate embodiments of the present invention is exemplary and non-limiting. For example, one of ordinary skill in the art will understand that one or more aspects or steps from one alternate embodiment can be combined with one or more aspects or steps from another alternate embodiment to create a new embodiment within the scope of the present invention.

BRIEF DESCRIPTION OF THE DRAWINGS

The foregoing and other aspects of these teachings are made more evident in the following Detailed Description of the Preferred Embodiments, when read in conjunction with the attached Drawing Figures, wherein.

DETAILED DESCRIPTION OF THE PREFERRED EMBODIMENTS

Figure 2:
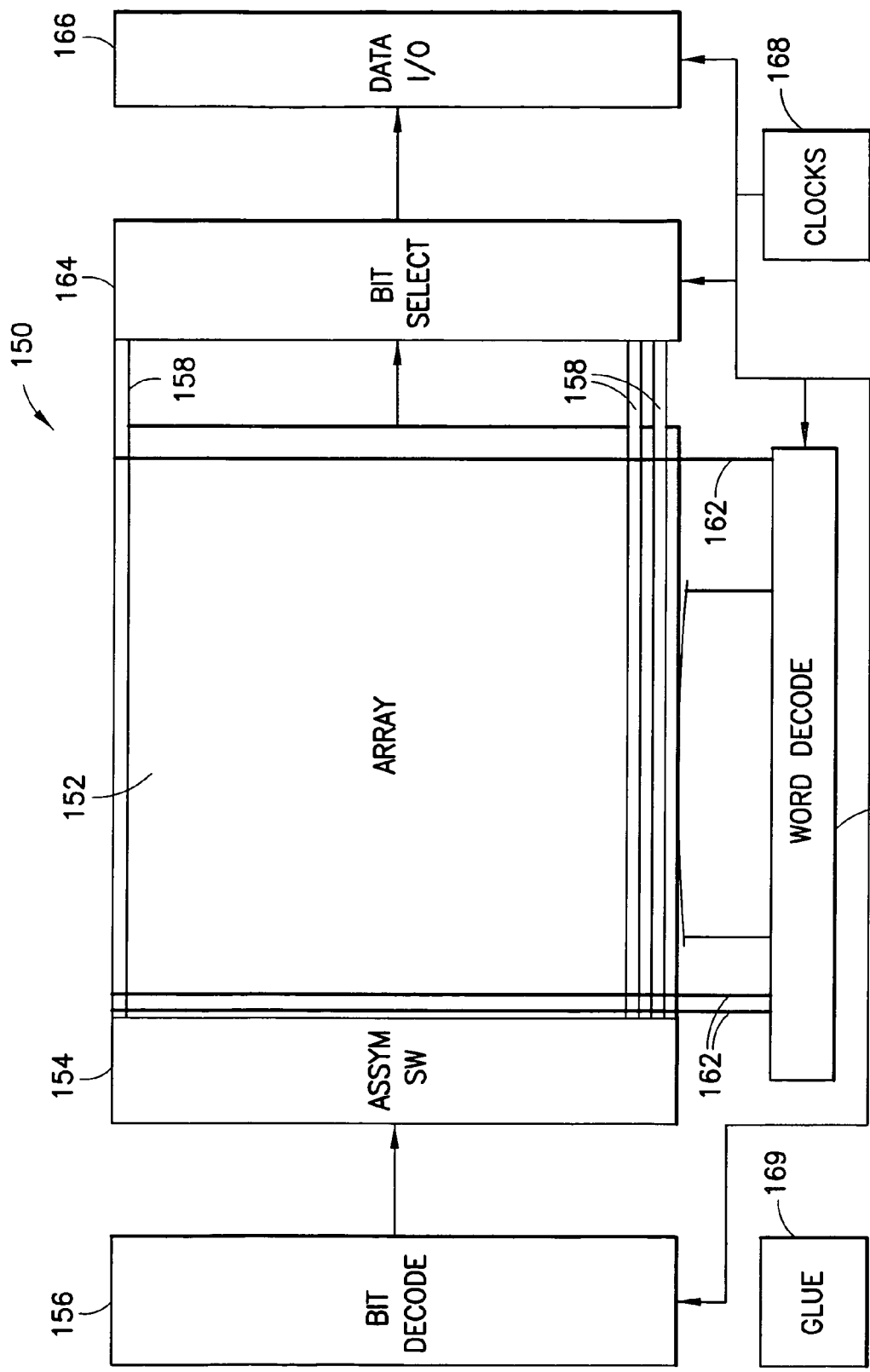
FIG. 2 depicts an M by N SRAM memory comprised of a plurality of SRAM cells with each SRAM cell supplied by a pair of independently coupled cell supply lines.

FIG. 2 depicts a storage memory with each column of cells supplied by a pair of selectively asymmetric cell supply lines. Preferably, the storage circuit 150 includes an array 152, sub-array or array of sub-arrays of static random access memory (SRAM) cells formed in CMOS. Normally, cell symmetry is maintained as a nominal supply voltage is commonly supplied on both column supply lines of each pair. During cell access the supply voltage is unbalanced for each column with accessed cells by applying an offset voltage to one column supply line and maintaining the nominal supply at the other. The unbalanced supply voltages favor the data state being written/read by making cells on each accessed column asymmetric during the access.

Supply asymmetry switches 154 selectively provide a higher, offset voltage, mutually exclusively, to one or the other of the cell supply line pairs. A bit decode circuit 156 decodes a bit address to select one of N columns 158 of cells in the array 152. Each of the N columns 158 of cells in the array 152 is connected to one of N pairs of column supply lines. A word decoder 160 selects a row of cells by driving one of M local word lines 162. So, in this example, the M by N array is addressed by coincidence of a selected row 162 with a selected column 158. During a read, bit select 164, which may include a sensing capability, selects one column 158 and buffers and re-drives data that is stored in the selected cells in that column 158. An active/passive supply couple, e.g., located with supply asymmetry switches 154 or with the bit select 164, passes a nominal supply voltage to the array 152; and when appropriate, allows the supply asymmetry switches 154 to mutually exclusively pass an offset voltage to one or the other of a pair of column supply lines. Examples of suitable supply couples include a resistor, diode or FET connected between the array supply and each of the column supply lines. Data input/output (I/O) drivers 166 receive input data and drive selected data from the bit select 164, for example, off chip. Clock logic 168 provides local timing and glue logic 169 provides local control, for example, read/write select, address gating and buffering, etc. In the present application, "SRAM array" generally refers to array portion 152 of SRAM memory 150 and "peripheral logic" refers to the remaining portions of the SRAM memory. Further, the SRAM memory 150 depicted in FIG. 2 is exemplary and the teachings of the present invention are applicable to CMOS SRAM memories having different designs than that depicted in FIG. 2.

Normally, the supply asymmetry switches 154 are open. Matched supply voltages (nominal) are provided to each pair of column supply lines to maintain cell symmetry. During accesses, supply asymmetric switches 154 switch the higher offset voltage onto one side of the cell in each column being accessed. Thus, the higher offset voltage unbalances the voltage on each pair of column supply lines, making the cells in each unbalanced column 158 asymmetric during the access. In particular, the offset voltage is switched such that the imbalance or asymmetry favors any data state being stored/read. So, the imbalance facilitates writing and reading data to and from preferred embodiment storage cells.

Figure 3:
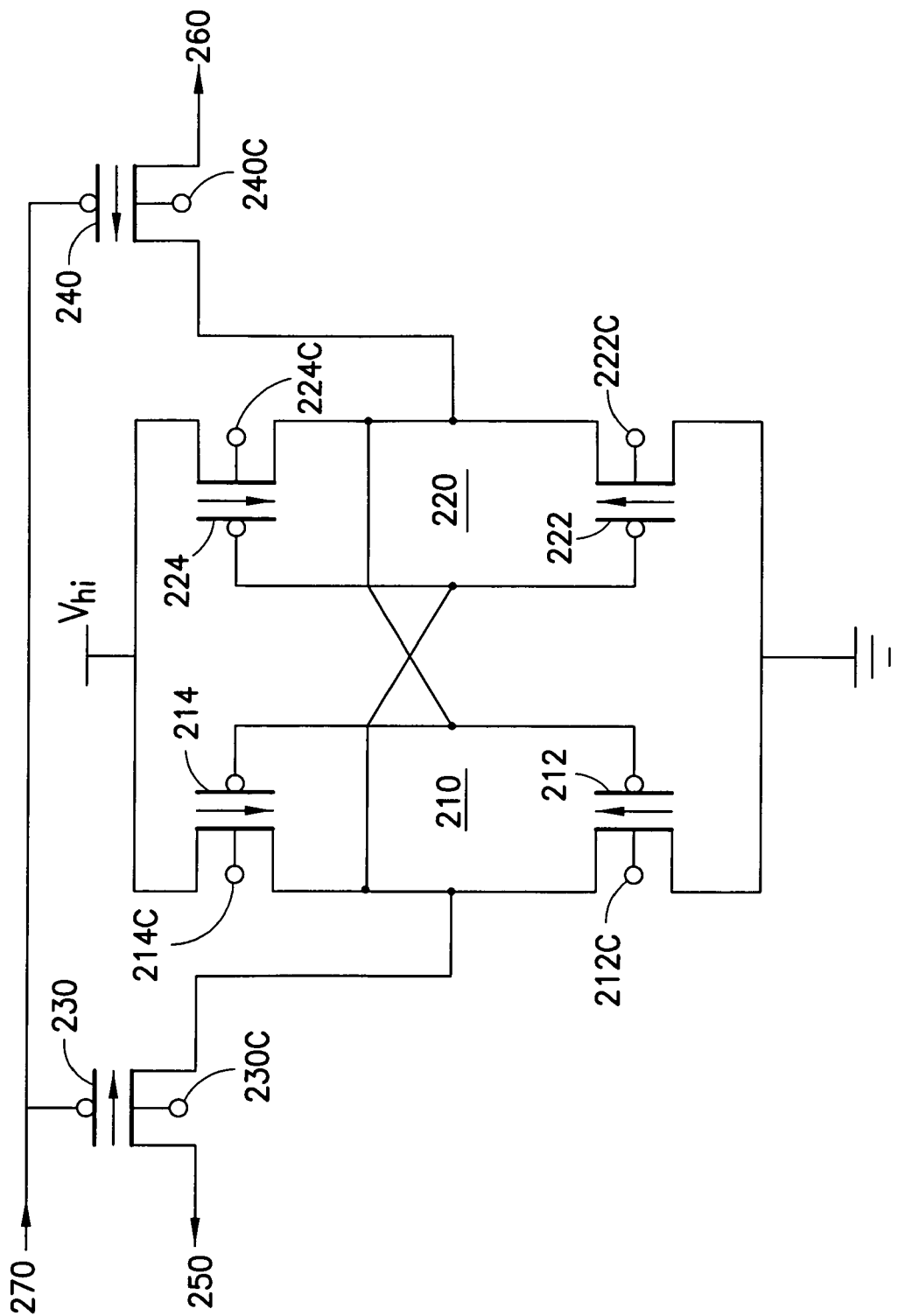
FIG. 3 is a schematic of a typical CMOS static RAM ("SRAM") cell.

FIG. 3 is a schematic of a typical CMOS Static RAM (SRAM) cell 200 that would comprise the array portion 152 of SRAM memory 150. The cell 200 is, essentially, an identical pair of cross coupled CMOS inverters 210, 220 and a pair of pass transistors 230, 240 between the cross coupled inverters 210, 220 and a pair of bit lines 250, 260. A word line 270 is tied to the gate of pass transistors 230, 240. Each CMOS inverter 210, 220 is, simply, an NFET 212, 222 and a PFET 214, 224. The gate and drain of each PFET 214, 224 is tied to the gate and drain of corresponding NFET 212, 222, respectively. The source of the PFETs 214, 224 are connected to supply voltage ($V_{hi}$) and the source of the NFETs 212, 222 are connected to GND. The channel body for each FET 212, 214, 222, 224, 230 and 240 is represented by node 212C, 214C, 222C, 224C, 230C and 240C, respectively. The state of the cross coupled inverter pair 210, 220 determines the state of data stored in the cell 200.

Each SRAM cell 200 is written by pulling one of the bit line pair 250, 260 high and the other low while holding word line 270 high so that both access transistors 230, 240 are on; and, then pulling the word line 270 low to turn off the access transistors 230, 240, trapping the state of the bit lines in the cross coupled inverters 210, 220. The SRAM cell 200 is read by pre-charging the bit lines 250, 260 to a known state; driving the word line 270 high which couples the cross coupled inverters 210, 220 through the access transistors 230, 240 to the bit line pair 250, 260; and, then, measuring the resulting voltage difference on the bit line pair 250, 260. The signal on the bit line pair 250, 260 increases with time toward a final state wherein each one of the pair 250, 260 may be, ultimately, a full up level and a full down level. However, to improve performance, the voltage difference is sensed well before the difference reaches its ultimate value.

Figure 1:
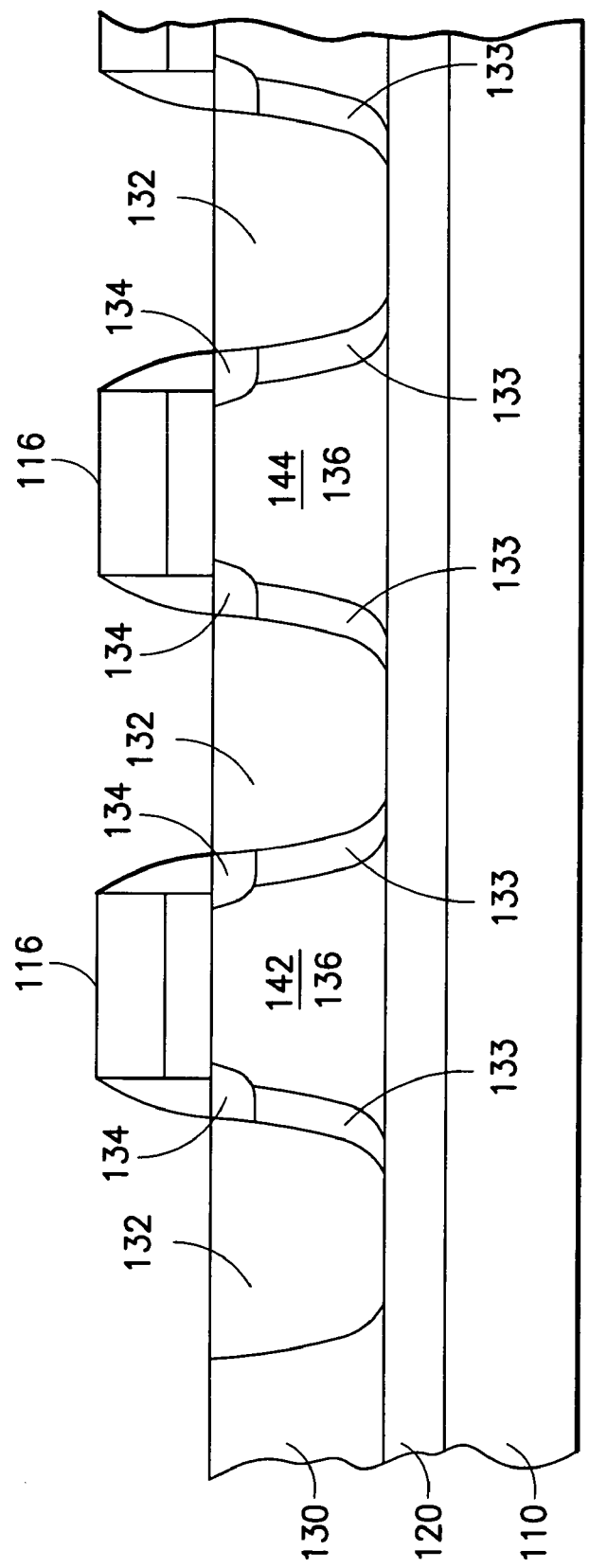
FIG. 1 is a cross-section of pull down and pass gate devices in prior art SOI SRAM cells.

As noted hereinabove, in a prior art bulk CMOS technology 214C, 224C, 230C and 340C were tied to GND and, 212C and 222C were tied to $V_{hi}$ biasing the respective devices. However, in the prior art SOI process of FIG. 1, all of the FETs 212, 214, 222, 224, 230 and 240 in an SRAM cell 200 have floating channels, i.e., 212C, 214C, 22C, 224C, 230C and 240C are not connected directly to any bias voltage and, at best, are capacitively coupled to underlying silicon substrate 110.

The body potential mismatch problem is solved in this invention by linking the bodies of adjacent devices together with a leakage path diffusion positioned beneath a shallow source/drain diffusion. This avoids butting of the deep source and drain implants against the backside of the silicon film in an SOI device. It creates shallow source and drain implants with a leakage path diffusion region near the backside of the SOI silicon film to allow the two bodies of neighboring devices to electrically connect to each other via the leakage path. In some embodiments made in accordance with this invention, the body of a PFET is linked to an adjacent PFET in a neighbor cell using shallow source and drain implants and a leakage path diffusion region. The bodies of NFETs are linked along the bit line and further connected to ground at two sides of the bit line row. By doing this, the threshold voltage mismatches between pull down and pass gate NFETs and between PFETs are reduced.

The shallow source drain implant is performed by blocking the source/drain area of SRAM FETs from the normal deep source drain implant and defining separate lithographic regions in the SRAM arrays coinciding with the leakage path diffusion regions to receive less energy or smaller doses of implanted species. By opening contacts on source drain diffusions of NFETs at both sides of one bit line row, the bodies of N-type devices can be tied to a fixed potential, such as ground, for enhanced performance. Performance depends on the effectiveness of body linking.

Figure 4:
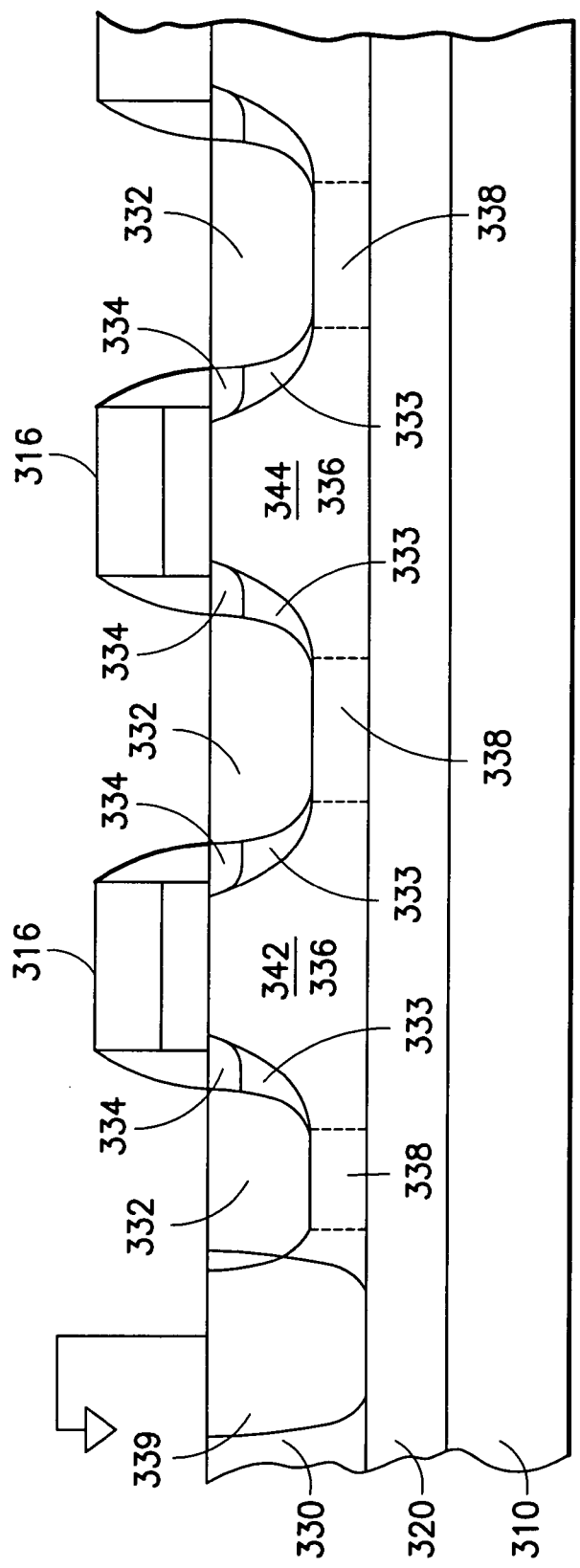
FIG. 4 is a cross-section of NFET pull down and pass gate NFET devices in an SOI CMOS SRAM cell made in accordance with the present invention.

To demonstrate the invention at work, a cross-section of the body linked and grounded pull down and pass gate devices is shown in FIG. 4. FIG. 4 shows a cross section of a CMOS SOI SRAM through a pair of NFET transistors 342, 344. The NFETs 342, 344 are formed in a thin silicon surface layer 330 that is isolated from an underlying silicon substrate 310 by a buried oxide (BOX) layer 320. In a typically complex series of mask steps, silicon-on-insulator ("SOI") regions are formed in the silicon surface layer 330 by etching shallow trenches through the surface layer 330 and filling the shallow trenches with oxide to isolate regions from each other. This type of isolation is normally referred to as shallow trench isolation ("STI"). STI is used to isolate circuits formed on the regions from each other and, also, isolate the FETs forming the circuits from each other.

After forming a gate oxide layer on the surface of the silicon regions, gates 316 are patterned and formed at the location of devices 342, 344. Source/drain regions 332 are defined using a standard implant and diffusion step, after forming lightly doped diffusion regions 334 at the gate boundaries, if desired. In various embodiments halo regions 333 can be formed by a separate diffusion step of the same species as the body region. In other embodiments halo regions can be deleted. In contrast to the device architecture depicted in FIG. 1 where device channels 136 are completely isolated from other channels by source/drain diffusions 132 at either end, in the device depicted in FIG. 4 device channels 336 are linked by a leakage path diffusion region 338. The leakage path diffusion region is counter-doped with the same dopant type as the source/drain diffusion but at relatively lower concentrations than the source/drain diffusion, thereby presenting a lower barrier to junction leakage than the source/drain regions.

Figure 5:
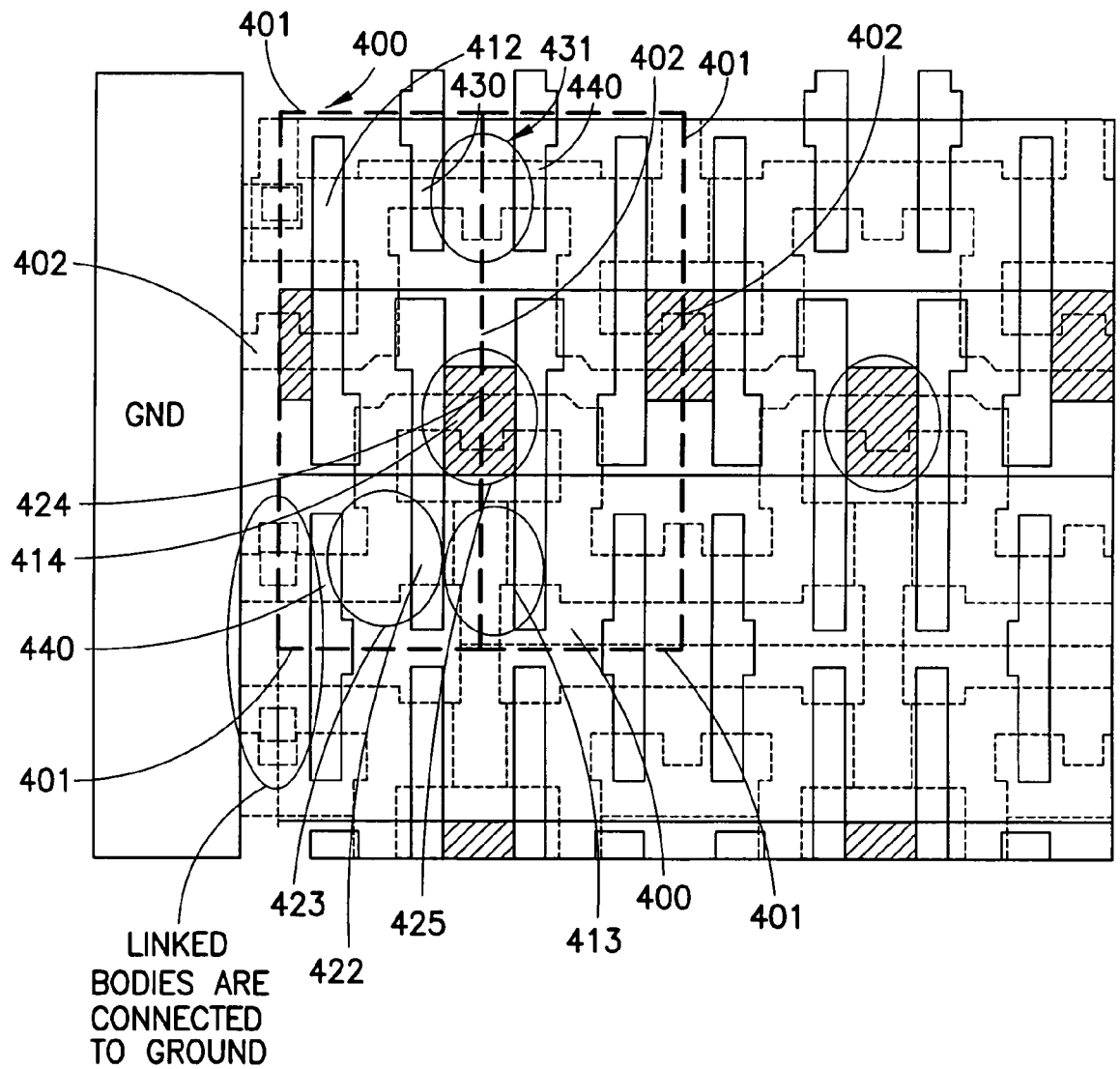
FIG. 5 depicts the layout and interrelationships among a couple of SOI CMOS SRAM cells made in accordance with the present invention.
Figure 6:
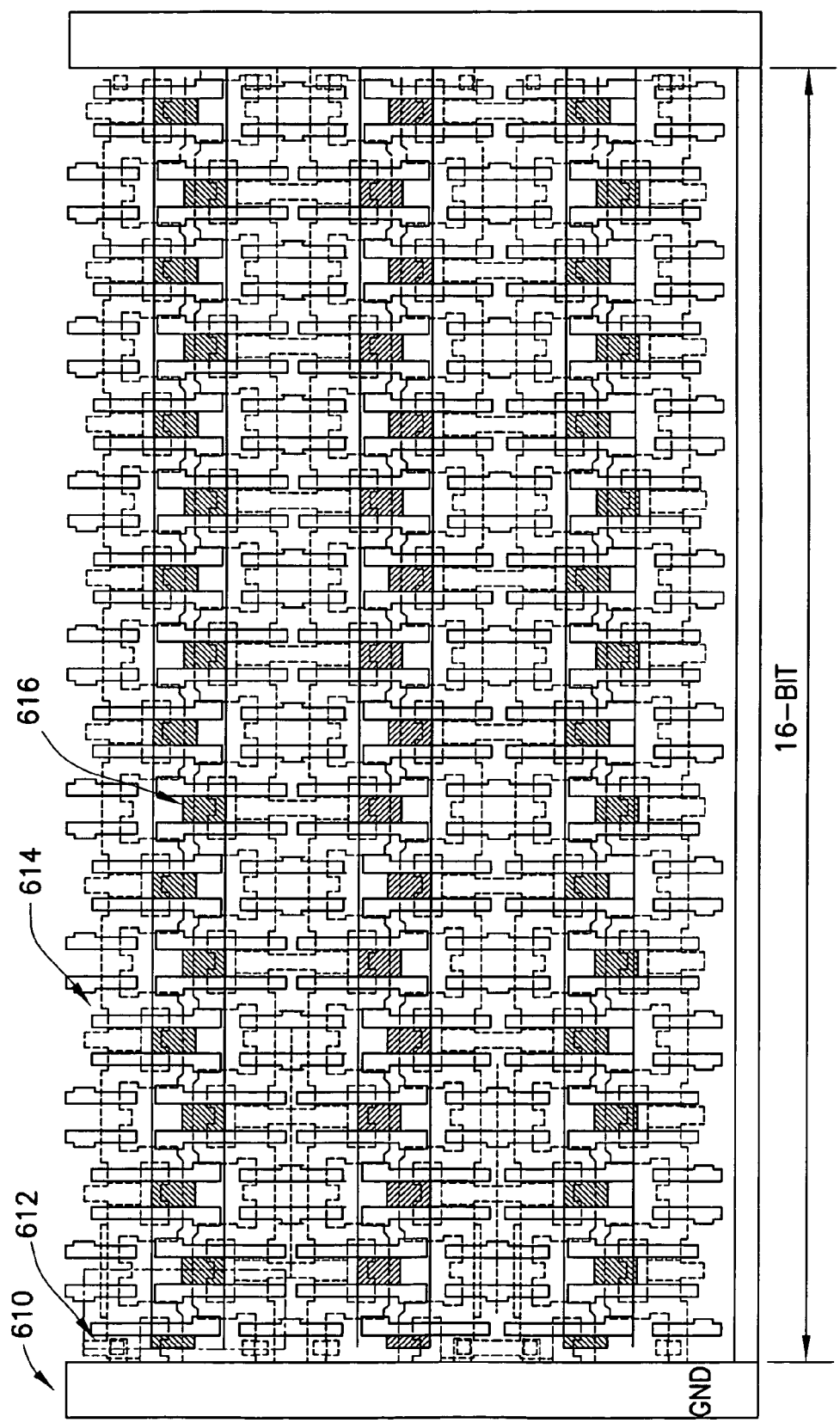
FIG. 6 depicts a larger portion of an SOI CMOS SRAM array made in accordance with the present invention.

Layouts of the body-linked SOI SRAM array/cells are illustrated in FIGS. 5–6. By connecting the bodies inter-cell (body links between pull down (inverter NFETs) and pass gates in FIG. 5) and intra-cell (body links between pass gates and pull downs in FIG. 5) using a leakage path diffusion region N+ implant mask "WN" in the region 614 depicted in FIG. 6, a connected body chain as shown in FIG. 4 is formed along the bit line direction. At the end of each chain, a metal line (610 in FIG. 6) can be used to connect each body chain together and tie to ground or a bias voltage for enhanced stability performance.

In FIG. 5 each SRAM cell 400 has two lateral sides 401 and two longitudinal sides 402. As used herein, "lateral" refers to the relatively short sides of the SRAM cell and "longitudinal" refers to the relatively long sides of the SRAM cell. The SRAM cells comprise cross-coupled inverters comprised of pull up inverter PFETs 414, 424 and pull down inverter NFETs 412, 422. The SRAM cells further comprise two pass gate NFETs 430, 440 for selectively coupling the cross-coupled inverters to bit lines. As shown in the embodiment depicted in FIG. 5, pairs of pass gates and pull down inverter NFETs ((412, 430) and (422, 440)) are arrayed along the lateral sides 401 of the SRAM cells. The pull up inverter PFETs 414, 424 are positioned intermediate between the pair of pass gate and pull down inverter NFETs along the longitudinal sides 402 of the SRAM cells. In the embodiment depicted in FIG. 5, the pairs of pass gate and pull down inverter NFETs ((412, 430) and (422, 440)) have body regions linked by leakage path diffusion regions formed beneath adjacent shallow source/drain diffusions. Pass gate NFETs positioned in adjacent cells also have body regions linked by leakage path diffusion regions, for example, in the region 431. Pull down inverter NFETs in adjacent SRAM cells 400 also have body regions linked with leakage path diffusion regions, for example, in the region 413. In the embodiment depicted in FIGS. 4–6, bit lines coincide with the upper and lower portions of the SRAM cells 400 and run from left to right. All NFETs along a particular bit line have body regions linked to adjacent NFETS in the embodiment depicted in FIG. 5. Pull up inverter PFETS 414, 424 from adjacent SRAM cells also have body regions linked by leakage path diffusion regions.

A particular advantage of the embodiment depicted in FIG. 5 is associated with the reduction in dimension of the lateral sides 401 of the SRAM cells associated with the rearrangement of the devices comprising the SRAM cell. This reduction reduces the path length of the linked body regions across a bit line of an SRAM cell, thereby reducing the resistance of the path. Reduction of the resistance enables charge to migrate more easily from the linked body regions and thereby improve the stability of the SRAM cells.

Bodies of P-type devices are linked in a similar way by using a leakage path diffusion region P+ implant mask "WP" in the regions 616 depicted in FIG. 6. One P-type device body is only linked to one neighbor P-type device body (as shown in FIG. 5) because there is no continuous P-type device active region across the SRAM array. The two body linked P-type devices will have reduced threshold voltage mismatch.

Tying the connected body chain of N-type devices to ground is implemented by performing a normal P+ source drain implant on the outside diffusions of edge cells 339 (FIG. 4) and opening contacts for the P+ regions and wiring the P+ contacts to a metal layer 610 (FIG. 6). Two sides of metal layers can be wired together.

Figure 7:
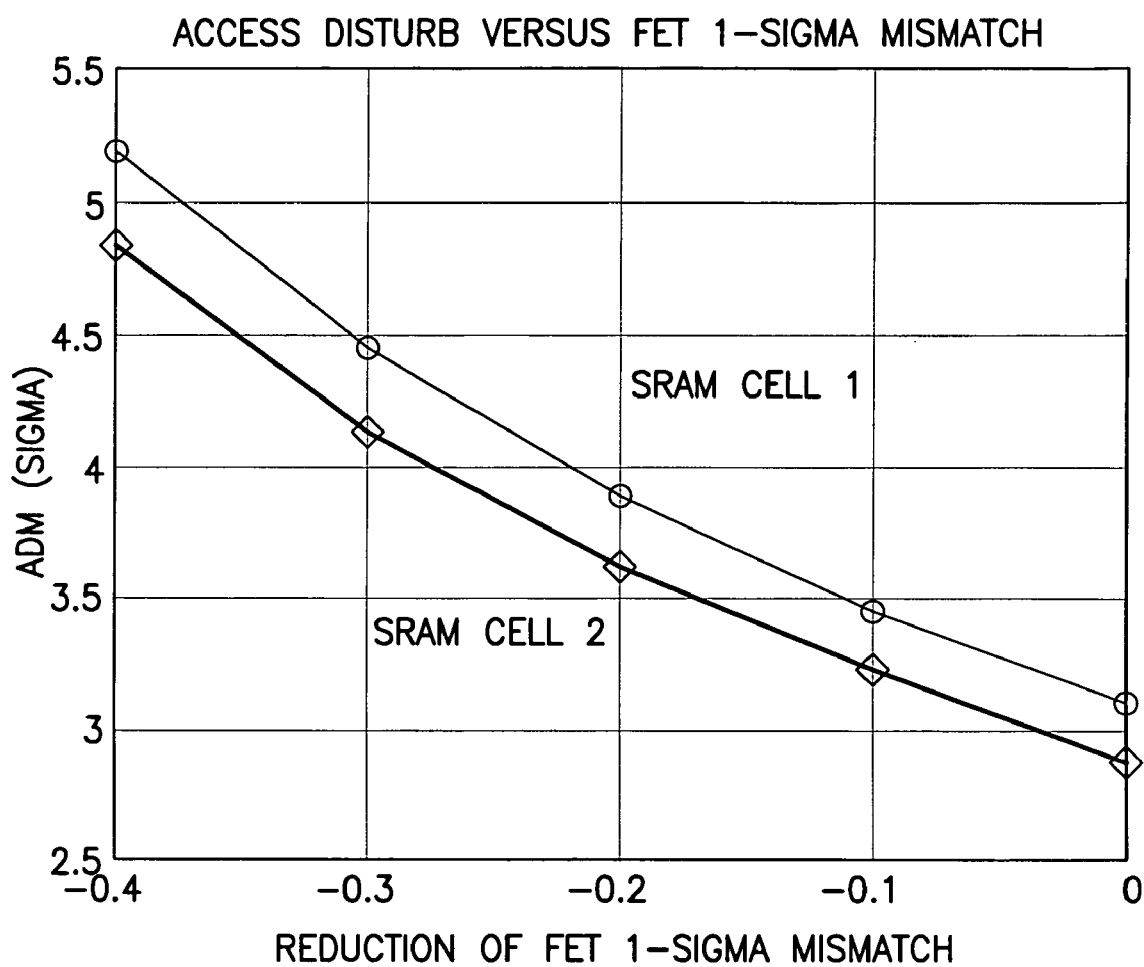
FIG. 7 depicts simulation results showing SRAM cell access disturb margin increases as FET threshold voltage mismatch decreases.

SRAM cell stability is studied using Access Disturb Margin approach. The stability dependence on threshold voltage mismatch is plotted in FIG. 7. The X-axis starts with 0 at right which represents current SRAM FET unit-sigma threshold mismatch read out from a typical robust process. With improving threshold voltage mismatch, the projected decreased mismatch goes from 0 to −40%. By varying the FET threshold voltage mismatch, simulation of the SRAM stability shows that the access disturb margin is improved by 66% as shown in FIG. 7 for both 65 nm SOI SRAM cells.

Figure 8:
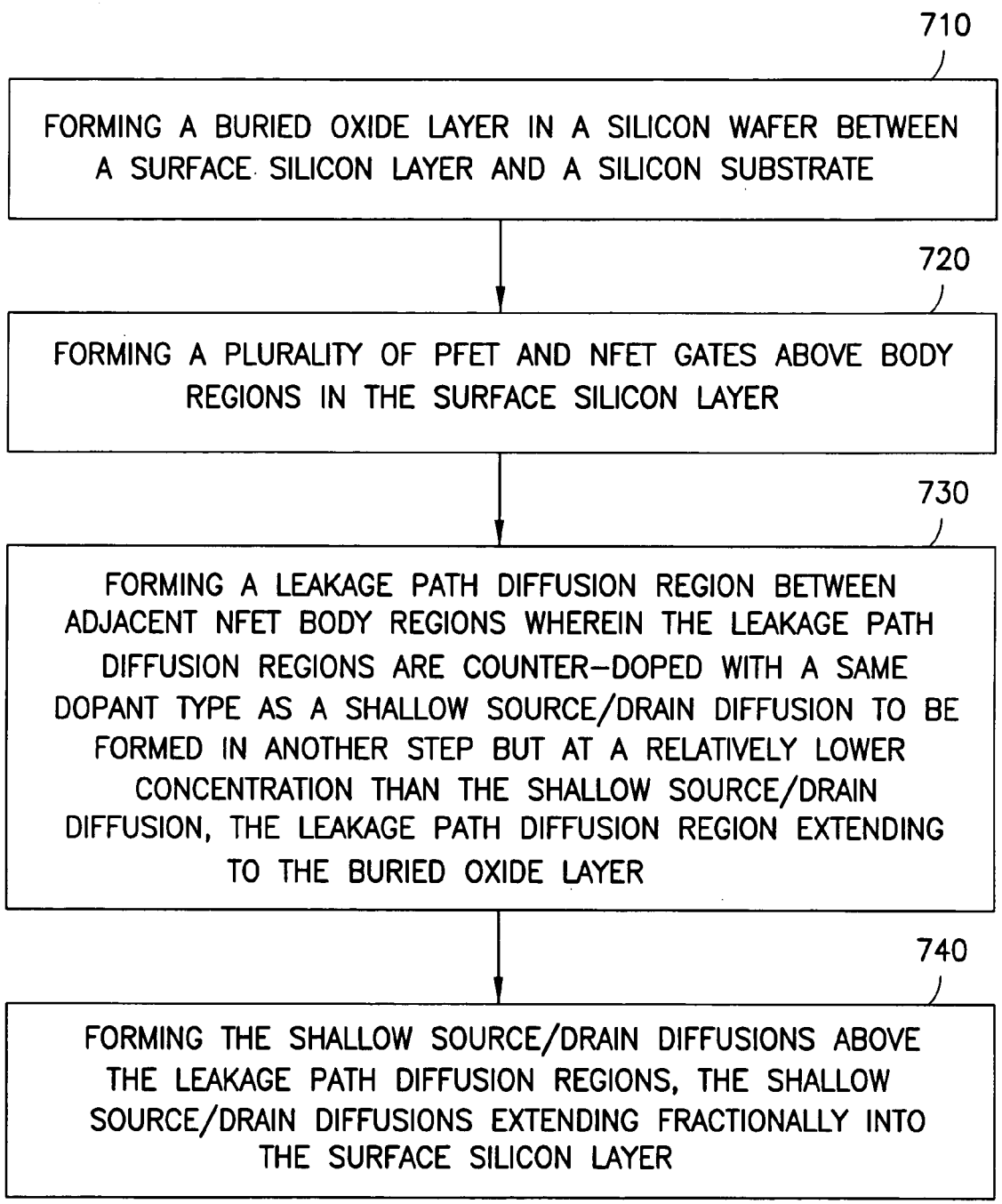
FIG. 8 depicts a method for fabricating an SOI CMOS SRAM array having leakage path diffusion regions positioned beneath shallow source/drain diffusions.

A method for fabricating a CMOS SRAM array in accordance with the present invention is depicted in FIG. 8. The SRAM array made in accordance with this method generally comprise a plurality of SRAM cells further comprising (1) a pair of cross-coupled CMOS inverters in a surface silicon layer disposed on an SOI buried-oxide layer, where each cross-coupled inverter comprises an NFET and a PFET and (2) a pair of NFET pass gate transistors selectively coupling a pair of bit lines to the cross-coupled inverters. In the first step at 710, a buried oxide layer is formed between a surface silicon layer and a silicon substrate. Next, at step 720 a plurality of PFET and NFET gates are formed above body regions in the surface silicon layer. Then, at step 730 a leakage path diffusion region is formed between at least a pair of body regions wherein the leakage path diffusion regions are counter-doped with a same dopant type as a shallow source-drain to be formed in step 740 but at a relatively lower concentration than the shallow source/drain diffusion. The leakage path diffusion region extends to the buried oxide layer. Next at step 740 shallow source/drain diffusions are formed above leakage path diffusion regions. The shallow source/drain diffusions extend fractionally into the surface silicon layer.

In one variant of the method depicted in FIG. 8, the underlying silicon wafer comprises (100) crystal orientation silicon, and additional steps would be performed to form (110) crystal orientation silicon regions in the substrate. The PFETs would then be formed in the (110) crystal orientation silicon. Methods for fabricating hybrid orientation substrates are described in Min Yang et al., "On the Integration of CMOS with Hybrid Crystal Orientations", 2004 IEEE Symposium on VLSI Technology Digest of Technical Papers, 2004, pp. 160–161, and U.S. patent application Ser. Nos. 10/725,850 and 10/830,347, all of which are hereby incorporated by reference in their entirety as if fully restated herein.

In another variant of the method depicted in FIG. 8 the leakage path diffusion region links the body regions of adjacent pass gate and inverter NFETs in an SRAM cell. In a further variant of the method depicted in FIG. 8, the SRAM cell comprises a six-transistor circuit, and the body regions of the four NFETs comprising the cell are linked with leakage path diffusion regions positioned beneath adjacent shallow source/drain diffusions. In yet another variant of the method depicted in FIG. 8, the body regions of NFETs coinciding with a bit line row are linked with leakage path diffusion regions positioned beneath adjacent shallow source/drain diffusions.

Figure 9:
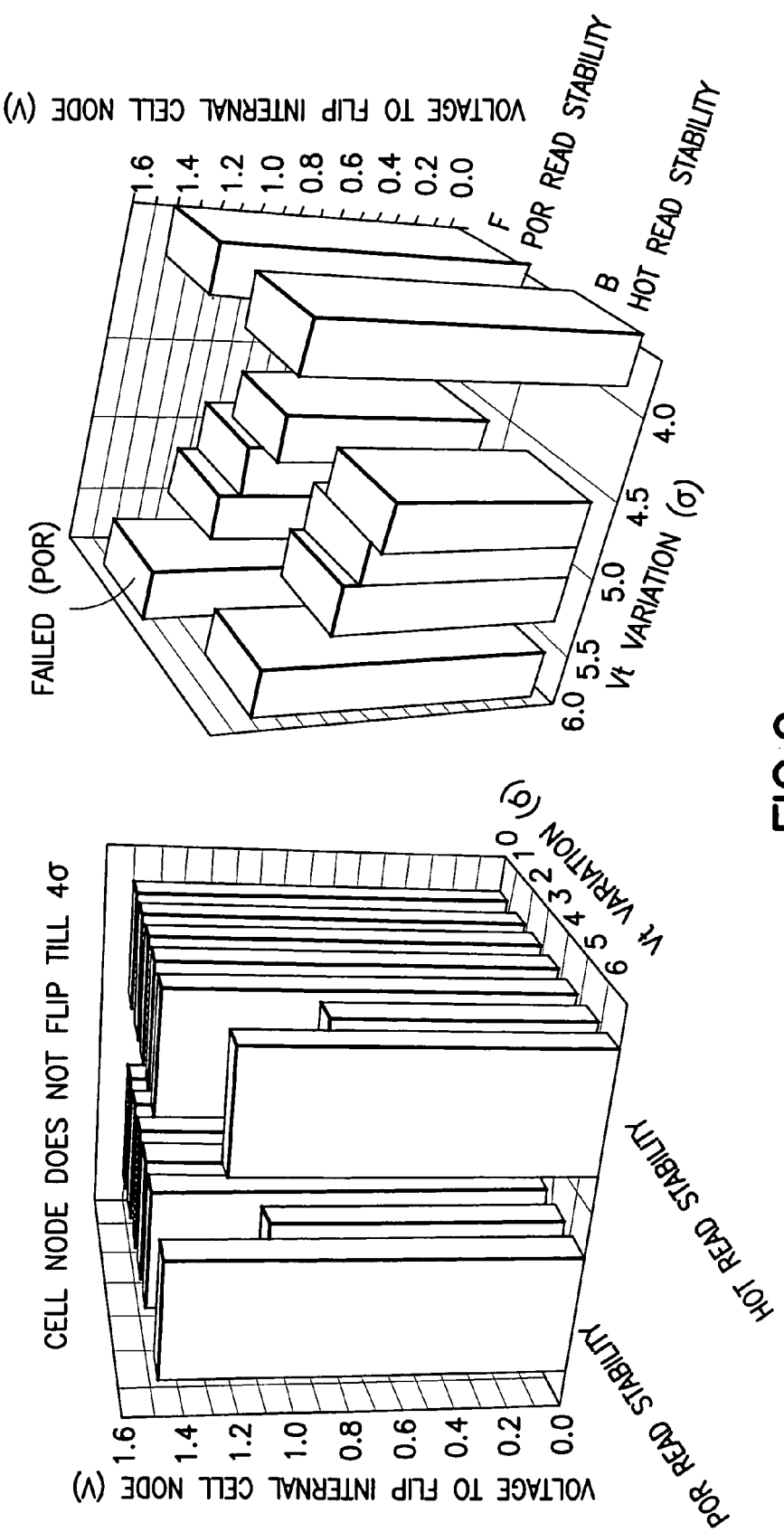
FIG. 9 depicts dynamic stability of SRAM cells fabricated in an hybrid orientation substrate compared to prior art SOI CMOS SRAM cells.

FIG. 9 depicts the improvement in dynamic stability of an SRAM cell made in accordance with the present invention. "POR" refers to the read stability of a conventional CMOS SOI SRAM cell with floating bodies. "HOT" refers to the read stability of a CMOS SOI SRAM cell fabricated in a hybrid substrate with NFETs fabricated in (100) crystal orientation SOI silicon regions with body regions linked by leakage path diffusion regions and PFETs fabricated in (110) crystal orientation silicon regions.

Figure 10:
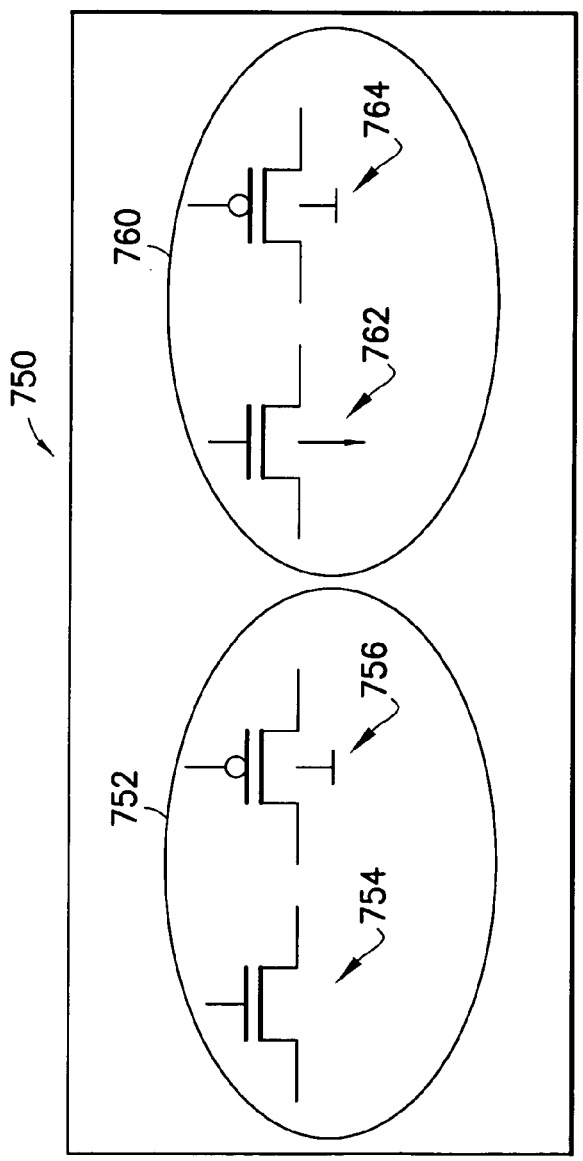
FIG. 10 depicts in conceptual terms fabrication method selections made for an SRAM memory made in accordance with the present invention.

FIG. 10 depicts in highly conceptual terms fabrication method selections made for an SRAM memory made in accordance with the present invention. The SRAM memory 750 as in the case of the memory depicted in FIG. 2 is comprised of a peripheral logic portion 752 and an SRAM array portion 760. In the example depicted in FIG. 10, the NFETs 754 of the peripheral logic portion are fabricated in SOI with floating body regions, and the PFETs 756 are fabricated in (110) crystal orientation bulk regions. The SRAM array portion 760 has NFETs 762 fabricated in (100) crystal orientation silicon SOI regions with linked bodies and PFETs 764 fabricated in (110) crystal orientation bulk silicon regions.

Figure 11:
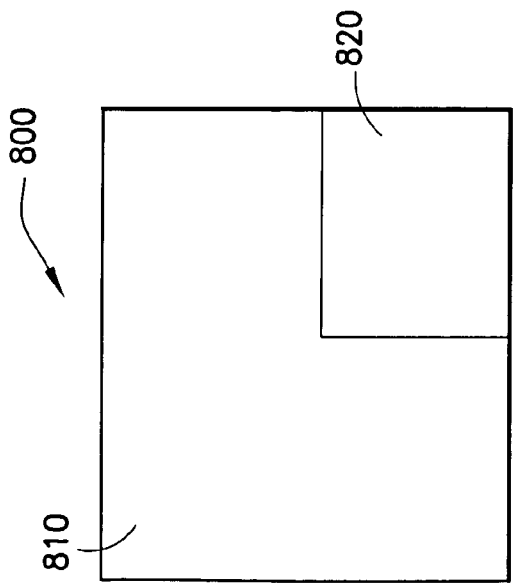
FIG. 11 depicts in a highly schematic form the architecture of a microprocessor made in accordance with the methods of the present invention.

FIG. 11 depicts in simplistic terms the structure of a microprocessor. In general terms, the microprocessor 800 comprises a logic portion 810 and cache memory portion 820. The cache memory portion typically comprises at least one CMOS SOI SRAM array. In one aspect of this invention, the logic portion 810 of the microprocessor 800 has NFETs fabricated in (100) crystal orientation SOI silicon regions with floating body regions and PFETs fabricated in (110) crystal orientation bulk silicon regions. The cache memory portion 820 comprises at least one CMOS SRAM array where the NFETs are fabricated in (100) crystal orientation SOI silicon regions with body regions linked by leakage path diffusion regions beneath shallow source/drain diffusions and PFETs fabricated in (110) crystal orientation silicon regions.

In other embodiments of the invention improved overall performance for SRAM memories is achieved by applying high-performance substrate technologies to peripheral logic portions of an SRAM memory in combination with the linked body technology applied to the memory array portion of the SRAM memory. For example, with reference to FIG. 2, in one embodiment of the present invention strained silicon substrate technology can be applied to the non-array portions of the SRAM memory. U.S. Pat. Nos. 5,906,951 and 6,603,156 describe methods for fabricating strained silicon substrates and are hereby incorporated by reference in its entirety as if fully restated herein. This would improve the speed of operation of the NFETs and PFETs comprising the peripheral logic portion of the SRAM memory. In another embodiment, hybrid orientation technology can be applied to the peripheral logic portion of the SRAM array. In hybrid orientation embodiments, the NFETs would be fabricated in (100) crystal orientation silicon regions and the PFETs in (110) crystal orientation silicon regions. In further hybrid orientation embodiments, the NFETs are fabricated in (100) crystal orientation SOI regions and the PFETs are fabricated in (110) crystal orientation bulk regions. In still further variants where speed of operation is desired, the NFETs fabricated in (100) crystal orientation SOI regions have floating body regions. In applications where other device characteristics are sought, the peripheral NFETs can be fabricated in bulk regions and the PFETs in SOI regions, where body regions of the PFETs are floating.

Figure 12:
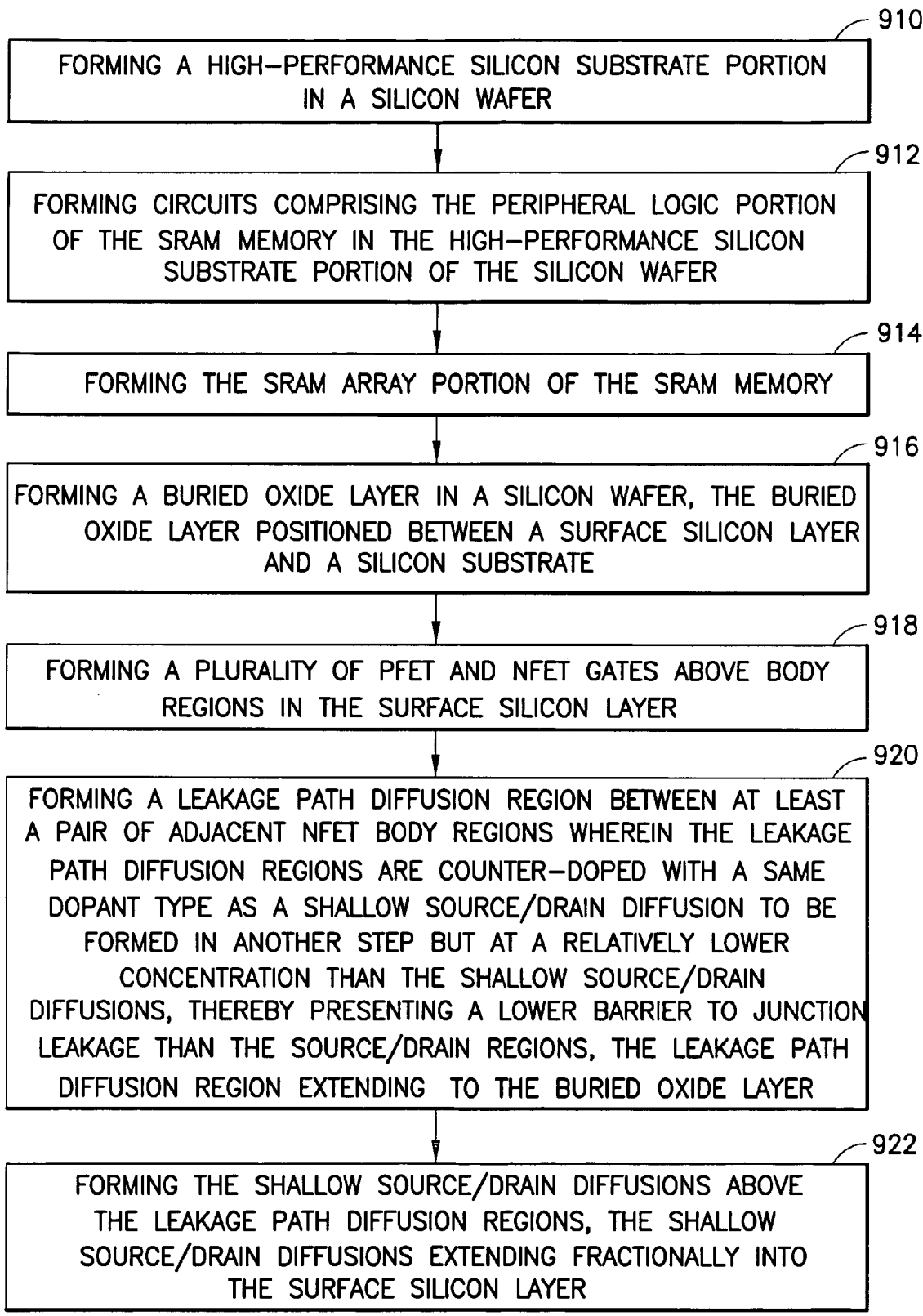
FIG. 12 depicts a method for fabricating an SOI CMOS SRAM memory having a peripheral logic portion fabricated in a high-performance silicon substrate.

An exemplary method for fabricating an SRAM memory having a peripheral logic portion implemented in a high-performance silicon substrate is depicted in FIG. 12. The SRAM memory created in the method of FIG. 12 comprises an SRAM array portion and the peripheral logic portion. The SRAM array portion comprises a plurality of SRAM cells, where each of the SRAM cells further comprises a pair of cross-coupled CMOS inverters in a surface silicon layer disposed on an SOI buried-oxide layer. The cross-coupled inverters each comprise an NFET and a PFET, and each SRAM cell has a pair of NFET pass gates coupling the cross-coupled inverters to bit lines. In the method, a high-performance silicon substrate portion is formed in a silicon substrate at step 910. Then, at step 912 circuits comprising the peripheral logic portion of the SRAM memory are formed in the high-performance silicon substrate portion of the silicon wafer. Next, at step 914, the SRAM array portion of the SRAM memory is formed. This comprises forming at step 916 a buried oxide layer in the silicon wafer, the buried oxide layer positioned between a surface silicon layer and a silicon substrate. Then, at step 918, a plurality of PFET and NFET gates are formed above body regions in the surface silicon layer. Next, at step 920, a leakage path diffusion region between at least a pair of adjacent NFET body regions wherein the leakage path diffusion regions are counter-doped with a same dopant type as a shallow source/drain diffusion to be formed in another step but at a relatively lower concentration than the shallow source/drain diffusions, thereby presenting a lower barrier to body-to-body leakage than the source/drain regions, the leakage path diffusion region extending to the buried oxide layer. Then, at step 922, shallow source/drain diffusions are formed above the leakage path diffusion regions, the shallow source/drain diffusions extending fractionally into the surface silicon layer.

One of ordinary skill in the art will understand that the ordering of the steps in FIG. 12 and other methods described herein is exemplary and that certain of the steps can be reordered. Any such reordering of the method in FIG. 12 is within the scope of Applicants' invention as herein described. Further, the steps of one method described herein can be combined with steps of another method described herein; all such variations are within the scope of the present invention.

In one variant of the method of FIG. 12, the high-performance silicon substrate portion comprises a hybrid orientation substrate having (100) crystal orientation silicon regions and (110) crystal orientation silicon regions.

In another variant of the present invention, the high-performance silicon substrate portion comprises a strained silicon region.

Thus it is seen that the foregoing description has provided by way of exemplary and non-limiting examples a full and informative description of the best method and apparatus presently contemplated by the inventors for creating CMOS SOI SRAM arrays having body regions of FETs linked with leakage path diffusion regions. One skilled in the art will appreciate that the various embodiments described herein can be practiced individually; in combination with one or more other embodiments described herein; or in combination with SOI CMOS SRAM architectures differing from those described herein. Further, one skilled in the art will appreciate that the present invention can be practiced by other than the described embodiments; that these described embodiments are presented for the purposes of illustration and not of limitation; and that the present invention is therefore limited only by the claims which follow.

We claim:

1. An SRAM array comprising a plurality of SRAM cells, each of said SRAM cells comprising:
  a pair of cross-coupled CMOS inverters in a surface silicon layer disposed on an SOI buried-oxide layer, where each cross-coupled inverter comprises an NFET and a PFET;
  a pair of NFET pass gates selectively coupling a pair of bit lines to said cross-coupled CMOS inverters; and
  where at least two adjacent NFETs of the SRAM cell share a leakage path between body regions, and where at least two adjacent NFETs have a source/drain diffusion region and a leakage path diffusion region under the source drain diffusion region positioned between their respective body regions, wherein the source/drain diffusion region extends fractionally into the surface silicon layer and the leakage path diffusion region extends from a bottom of the source/drain diffusion down to the SOI buried-oxide layer, and where the leakage path diffusion region is counter-doped with the same dopant type as the source/drain diffusion but at relatively lower concentrations than the source/drain diffusion, thereby presenting a lower barrier to junction leakage than the source/drain regions.

2. The SRAM array of claim 1 where the leakage path diffusion region under the source/drain diffusion region is counter-doped with a different species than the source/drain diffusion region.

3. The SRAM array of claim 1, wherein each SRAM cell is a six-transistor CMOS SRAM cell, and where the body regions of the four NFETs of the six-transistor CMOS SRAM cell are all linked together with leakage path diffusion regions formed beneath adjacent shallow source/drain diffusions.

4. The SRAM array of claim 1, wherein one of the NFETs sharing the leakage path diffusion region is one of the pass gate NFETs and the other NFET sharing the leakage path diffusion region is one of the inverter NFETs.

5. The SRAM array of claim 1 wherein the NFETs are fabricated in (100) crystal orientation silicon regions.

6. The SRAM array of claim 1 wherein the PFETs are fabricated in (110) crystal orientation silicon regions.

7. A pair of adjacent SRAM cells in an SRAM array, the pair comprising a first SRAM cell and a second SRAM cell, each of the adjacent SRAM cells comprising:
  a pair of cross-coupled CMOS inverters in a surface silicon layer disposed on an SOI buried oxide layer, where each cross-coupled inverter comprises an NFET and a PFET;
  a pair of NFET pass gates selectively coupling a pair of bit lines to said cross-coupled CMOS inverters; and
  where at least one of the NFETs from the first SRAM cell and at least one of the NFETs from the second SRAM cell share a leakage path between body regions, the respective NFETs sharing a leakage path being adjacent to one another and where the at least two adjacent NFETs have a source/drain diffusion region and a leakage path diffusion region under the source/drain diffusion region positioned between their respective body regions, wherein the source/drain diffusion region extends fractionally into the surface silicon layer and the leakage path diffusion region extends from a bottom of the source/drain diffusion down to the SOI buried-oxide layer, and where the leakage path diffusion region is counter-doped with the same dopant type as the source/drain diffusion but at relatively lower concentrations than the source/drain diffusion, thereby presenting a lower barrier to junction leakage than the source/drain regions.

8. The pair of adjacent SRAM cells of claim 7, wherein the body regions of the NFETs from the first and second SRAM cells sharing a leakage path diffusion region are coupled to an external bias voltage through the leakage path diffusion region.

9. The pair of adjacent SRAM cells of claim 7, wherein the body regions of the NFETs from the first and second SRAM cells sharing a leakage path diffusion region are coupled to ground through the leakage path diffusion region.

10. The pair of adjacent SRAM cells of claim 7, wherein the body regions of each of the NFETs from the first and second adjacent SRAM cells sharing a leakage path diffusion region further are linked to the body region of another adjacent NFET from their respective SRAM cell with leakage path diffusion regions formed beneath adjacent shallow source/drain diffusions.

11. The pair of adjacent SRAM cells of claim 10 wherein each of the NFETs from the first and second SRAM cells sharing a leakage path diffusion region between body regions are pass gate NFETs, and where the NFETs from the respective SRAM cells having a body region linked to the body region of the pass gate NFETs by leakage path diffusion regions are inverter NFETs.

12. The pair of adjacent SRAM cells of claim 10 wherein each of the NFETs from the first and second SRAM cells sharing a leakage path diffusion region between body regions are inverter NFETs, and where the NFETs from the respective SRAM cells having a body region linked to the body region of the inverter NFETs by leakage path diffusion regions are pass gate NFETs.

13. The pair of adjacent SRAM cells of claim 7, wherein each SRAM cell is a six transistor SRAM cell, and where the body regions of the four NFETs of each of the six transistor CMOS SRAM cells are all linked together with leakage path diffusion regions formed beneath adjacent shallow source/drain diffusions.

14. The SRAM array of claim 7 wherein the NFETs are fabricated in (100) crystal orientation silicon regions.

15. The SRAM array of claim 7 wherein the PFETs are fabricated in (110) crystal orientation silicon regions.

16. A pair of adjacent SRAM cells in an SRAM array, the pair comprising a first SRAM cell and a second SRAM cell, each of the adjacent SRAM cells comprising:
  a pair of cross-coupled CMOS inverters in a surface silicon layer disposed on an SOI buried oxide layer, where each cross-coupled inverter comprises an NFET and a PFET;
  a pair of NFET pass gates selectively coupling a pair of bit lines to said cross-coupled inverters; and where at least one of the PFETs from the first SRAM cell and at least one of the PFETs from the second SRAM cell share a leakage path between body regions, the respective PFETs sharing a leakage path being adjacent to one another and where the at least two adjacent PFETs have a source/drain diffusion region and a leakage path diffusion region under the source/drain diffusion region positioned between their respective body regions, wherein the source/drain diffusion region extends fractionally into the surface silicon layer and the leakage path diffusion region extends from a bottom of the source/drain diffusion down to the SOI buried-oxide layer, and where the leakage path diffusion region is counter-doped with the same dopant type as the source/drain diffusion but at relatively lower concentrations than the source/drain diffusion, thereby presenting a lower barrier to junction leakage than the source/drain regions.

17. The SRAM array of claim 16 wherein the NFETs are fabricated in (100) crystal orientation silicon regions.

18. The SRAM array of claim 16 wherein the PFETs are fabricated in (110) crystal orientation silicon regions.

19. A pair of adjacent SRAM cells in an SRAM array, the pair comprising a first SRAM cell and a second SRAM cell, where each of the SRAM cells have two longitudinal and two lateral sides, the adjacent SRAM cells sharing a longitudinal side, each of the adjacent SRAM cells comprising:
   a pair of cross-coupled CMOS inverters in a surface silicon layer disposed on an SOI buried-oxide layer, wherein the cross-coupled CMOS inverters each comprise an NFET and a PFET;
   a pair of NFET pass gates selectively coupling a pair of bit lines to said cross-coupled CMOS inverters, and
   wherein one each of the pass gate NFETs and inverter NFETs are positioned along each of the lateral sides of the SRAM cell, whereby the pass gate NFET and inverter NFET positioned on the same lateral side of the SRAM cell comprise a pair and have body regions linked with leakage path diffusion regions formed beneath adjacent shallow source/drain diffusions wherein the shallow source/drain diffusion region extends fractionally into the surface silicon layer and the leakage path diffusion region extends from a bottom of the source/drain diffusion down to the SOI buried-oxide layer, and where the leakage path diffusion region is counter-doped with the same dopant type as the source/drain diffusion but at relatively lower concentrations than the source/drain diffusion, thereby presenting a lower baffler to junction leakage than the source/drain regions.

20. The pair of adjacent SRAM cells of claim 19 where the body regions of the pairs of pass gate NFETs and inverter NFETs arrayed along each of the lateral sides of the first SRAM cell are linked to the body regions of the pairs of pass gate NFETs and inverter NFETs in the adjacent second SRAM cell with leakage path diffusion regions formed beneath adjacent shallow source/drain diffusions.

21. The pair of adjacent SRAM cells of claim 19 where in each of the SRAM cells one of the inverter PFETs is positioned along each of the longitudinal sides of the SRAM cell intermediate between the pairs of pass gate NFETs and inverter NFETs positioned along each of the lateral sides of the SRAM cell.

22. The pair of adjacent SRAM cells of claim 21 where the body regions of the PFETs positioned along the shared longitudinal side of the adjacent first and second SRAM cells are linked with leakage path diffusion regions formed beneath adjacent shallow source/drain diffusions.

23. The pair of adjacent SRAM cells of claim 20 wherein on a first lateral side and along the shared longitudinal side of the first SRAM cell the body region of one of the NFET pass gates of the first SRAM cell is linked to the body region of one of the NFET pass gates of the second SRAM cell with the leakage path diffusion regions formed beneath adjacent shallow source/drain diffusions.

24. The pair of adjacent SRAM cells of claim 20 wherein on a first lateral side and along the shared longitudinal side of the first SRAM cell the body region of one of the inverter NFETS of the first SRAM cell is linked to the body region of one of the inverter NFETs of the second SRAM cell with the leakage path diffusion regions formed beneath adjacent shallow source/drain diffusions.

25. The pair of adjacent SRAM cells of claim 20, wherein the body regions of the NFETs from the first and second SRAM cells sharing a leakage path diffusion region are coupled to an external bias voltage through the leakage path diffusion regions.

26. The pair of adjacent SRAM cells of claim 20, wherein the body regions of the NFETs from the first and second SRAM cells sharing a leakage path diffusion region are coupled to ground through the leakage path diffusion regions.

27. The pair of adjacent SRAM cells of claim 19 wherein the NFETs are fabricated in (100) crystal orientation silicon regions.

28. The pairs of adjacent SRAM cells of claim 19 wherein the PFETs are fabricated in (110) crystal orientation silicon regions.

29. An SRAM array comprising a plurality of SRAM cells organized in rows and columns,
   wherein each of the SRAM cells have two longitudinal sides and two lateral sides, the SRAM cells further comprising:
      a pair of cross-coupled CMOS inverters in a surface silicon layer disposed on an SOI buried-oxide layer, where each cross-coupled inverter comprises an NFET and a PFET;
      a pair of NFET pass gates selectively coupling a pair of bit lines to said cross-coupled CMOS inverters; and
      where at least two adjacent NFETs of the SRAM cell share a leakage path between body regions, and where the at least two adjacent NFETs have a source/drain diffusion region and a leakage path diffusion region under the source/drain diffusion region positioned between their respective body regions, wherein the source/drain diffusion region extends fractionally into the surface silicon layer and the leakage path diffusion region extends from a bottom of the source/drain diffusion down to the SOI buried-oxide layer, and where the leakage path diffusion region is counter-doped with the same dopant type as the source/drain diffusion but at relatively lower concentrations than the source/drain diffusion, thereby presenting a lower barrier to junction leakage than the source/drain regions, and
   where each of the SRAM cells arrayed in a particular row of the SRAM array share longitudinal sides with two other SRAM cells positioned in the same row, except for at least two of the SRAM cells one longitudinal side of each coincides with a termination point of the row, and where the at least two adjacent NFETs of each SRAM cell arrayed in the particular row of the SRAM array having body regions linked by the leakage path diffusion region have their body regions further linked to the body regions of NFETs contained in adjacent SRAM cells sharing longitudinal sides with the SRAM cell with leakage path diffusion regions positioned beneath adjacent shallow source/drain diffusion regions, except for the at least two of the SRAM cells having one longitudinal side coinciding with the termination point of the row which have at least one pair of NFETs having a body region linked to the body regions of NFETs positioned in one SRAM cell on a longitudinal side opposite from the termination point of the row with leakage path diffusion regions positioned beneath adjacent shallow source/drain diffusion regions; and whereby a continuous chain of NFETS having body regions linked with leakage path diffusion regions positioned beneath adjacent shallow source/drain diffusion regions exists across the particular row of the SRAM array.

30. The SRAM array of claim 29 where a body region of at least one PFET in each SRAM cell arrayed along the particular row of the SRAM array is linked to a body region of a PFET positioned in an adjacent SRAM cell sharing a longitudinal side with a leakage path diffusion region positioned beneath adjacent shallow source/drain diffusion regions.

31. The SRAM array of claim 29 wherein the NFETs are fabricated in (100) crystal orientation silicon regions.

32. The SRAM array of claim 29 wherein the PFETs are fabricated in (110) crystal orientation silicon regions.

33. The SRAM array of claim 29 where the at least two NFETs sharing a leakage path diffusion region (between body regions) in at least one of the SRAM cells having a longitudinal side coinciding with one of the termination points of the particular row have their body regions coupled to a bias voltage on the lateral side coinciding with one of the termination points of the particular row.

34. The SRAM array of claim 29 where the at least two NFETs sharing a leakage path diffusion region (between body regions) in at least one of the SRAM cells having a longitudinal side coinciding with one of the termination points of the particular row have their body regions coupled to ground on the lateral side coinciding with one of the termination points of the particular row.

35. A microprocessor fabricated on a CMOS hybrid orientation substrate, wherein the microprocessor comprises a logic portion and a cache memory portion, wherein the cache memory portion further comprises at least one CMOS SRAM array and where:

the logic portion comprises, in part, PFETs fabricated in (110) crystal orientation bulk silicon regions and NFETs fabricated in (100) crystal orientation SOT silicon regions, wherein the NFETs in the logic portion have floating body regions; and the CMOS SRAM array comprises a plurality of CMOS SRAM cells comprising, in part, PFETs fabricated in (110) crystal orientation silicon regions and NFETs fabricated in (100) crystal orientation SOT silicon regions, wherein at least a portion of the NFETs in the CMOS SRAM cells have body regions linked to body regions of adjacent NFETs with leakage path diffusion regions formed beneath adjacent shallow source/drain diffusions wherein the source/drain diffusion regions extend fractionally into a surface silicon layer and the leakage path diffusion regions extend from bottoms of the source/drain diffusions down to an SOI buried-oxide layer, and where the leakage path diffusion regions are counter-doped with the same dopant type as the source/drain diffusions but at relatively lower concentrations than the source/drain diffusions, thereby presenting a lower barrier to junction leakage than the source/drain regions.

36. An SRAM memory comprising:

peripheral logic fabricated in a high-performance silicon substrate;

an SRAM array comprised of a plurality of SRAM cells, wherein the SRAM cells are arrayed in rows and columns and further comprise:

a pair of cross-coupled CMOS inverters in a surface silicon layer disposed on an SOI buried-oxide layer, wherein the cross-coupled CMOS inverters each comprise an NFET and a PFET;

a pair of NFET pass gates selectively coupling a pair of bit lines to said cross-coupled CMOS inverters, where body regions of NFETs arrayed along a column of SRAM cells coinciding with a bit line are linked by leakage path diffusion regions beneath adjacent shallow source drain diffusion regions, thereby forming a chain of linked body regions.

37. The SRAM memory of claim 36 where the high-performance silicon substrate of the peripheral logic comprises a strained silicon region.

38. The SRAM memory of claim 36 where the high-performance silicon substrate of the peripheral logic comprises a hybrid orientation substrate, where the NFETs are fabricated in (100) crystal orientation silicon regions and PFETs are fabricated in (110) crystal orientation silicon regions.

39. The SRAM memory of claim 36 where a column of SRAM cells coinciding with a bit line staffs at a first SRAM cell and terminates at a last SRAM cell, there being intermediate SRAM cells disposed between the first and last SRAM cells, where the chain of linked body regions of NFETs are coupled to a selective bias voltage at the first SRAM cell and at the last SRAM cell along the column.

40. The SRAM memory of claim 39 where the selective bias voltage is ground.

41. The SRAM memory of claim 39 where the column starting at the first SRAM cell and ending at the last SRAM cell and coinciding with the bit line comprises sixteen SRAM cells.

42. The SRAM memory of claim 39 where a side of each SRAM cell coinciding with the bit line is relatively short when compared to a side of each SRAM cell running orthogonal to the bit line row, whereby the reduced dimension of the side of the SRAM cell coinciding with the bit line row serves to reduce the resistance of a path formed by the leakage path regions joining the body regions of the NFETs along the bit line row.

43. An SRAM memory comprising:

peripheral logic comprised of CMOS NFETs and PFETs, where the NFETs are fabricated in bulk silicon regions and the PFETs are fabricated in SOI silicon regions, where body regions of the PFETs are floating; and an SRAM array comprised of a plurality of SRAM cells, wherein the SRAM cells are arrayed in rows and columns and further comprise:

a pair of cross-coupled CMOS inverters in a surface silicon layer disposed on an SOI buried-oxide layer, wherein the cross-coupled CMOS inverters each comprise an NFET and a PFET;

a pair of NFET pass gates selectively coupling a pair of bit lines to said cross-coupled CMOS inverters, where body regions of NFETs along a column of SRAM cells coinciding with a bit line are linked by leakage path diffusion regions beneath adjacent shallow source drain diffusion regions, thereby forming a chain of linked body regions.

44. The SRAM memory of claim 43 where at least two PFETs from adjacent SRAM cells are linked by leakage path diffusion regions beneath adjacent shallow source/drain diffusion regions.

45. The SRAM memory of claim 43 where the PFETs of the peripheral logic are fabricated in (110) crystal orientation SOI silicon regions.

46. The SRAM memory of claim 43 where the PFETs of the SRAM array are fabricated in (110) crystal orientation silicon regions.

47. The SRAM memory of claim 46 where the PFETs of the SRAM array are further fabricated in bulk regions.

48. The SRAM memory of claim 43 where a column of SRAM cells coinciding with a bit line starts at a first SRAM cell and terminates at a last SRAM cell, there being intermediate SRAM cells disposed between the first and last SRAM cells, where the chain of linked body regions of NFETs are coupled to a selective bias voltage at the first SRAM cell and at the last SRAM cell along the column.

49. The SRAM memory of claim 48 where the selective bias voltage is ground.

50. The SRAM memory of claim 48 where the column starting at the first SRAM cell and ending at the last SRAM cell and coinciding with the bit line comprises sixteen SRAM cells.

51. The SRAM memory of claim 48 where a side of each SRAM cell coinciding with the bit line is relatively short when compared to a side of each SRAM cell running orthogonal to the bit line row, whereby the reduced dimension of the side of the SRAM cell coinciding with the bit line row serves to reduce the resistance of a path formed by the leakage path regions joining the body regions of the NFETs along the bit line row.

* * * * *